(12) United States Patent
Choi et al.

(10) Patent No.: US 9,530,933 B2
(45) Date of Patent: Dec. 27, 2016

(54) GAN BASE LIGHT-EMITTING DIODE AND MANUFACTURING METHOD THEREFOR USING MECHANICAL POST-PROCESSING

(71) Applicant: SAMSUNG ELECTRONICS CO., LTD., Suwon-si (KR)

(72) Inventors: Junhee Choi, Seongnam-si (KR); Sangwon Kim, Seoul (KR); Hoyoung Ahn, Suwon-si (KR); Eunhong Lee, Anyang-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 14/909,297

(22) PCT Filed: Jul. 30, 2014

(86) PCT No.: PCT/KR2014/006987
§ 371 (c)(1),
(2) Date: Feb. 1, 2016

(87) PCT Pub. No.: WO2015/016602
PCT Pub. Date: Feb. 5, 2015

(65) Prior Publication Data
US 2016/0172535 A1 Jun. 16, 2016

(30) Foreign Application Priority Data
Jul. 31, 2013 (KR) .................. 10-2013-0091161

(51) Int. Cl.
*H01L 33/00* (2010.01)
*H01L 29/06* (2006.01)
(Continued)

(52) U.S. Cl.
CPC .......... *H01L 33/06* (2013.01); *H01L 33/0075* (2013.01); *H01L 33/24* (2013.01); *H01L 33/32* (2013.01);
(Continued)

(58) Field of Classification Search
CPC ........... H01L 33/06; H01L 33/24; H01L 33/32
(Continued)

(56) References Cited

U.S. PATENT DOCUMENTS 6,734,030 B2 * 5/2004 Doi ................... H01L 21/76262
257/88
8,409,886 B2 4/2013 Iwafuchi et al.
(Continued)

FOREIGN PATENT DOCUMENTS

JP 2003-31841 A 1/2003
JP 2003-124513 A 4/2003
(Continued)

OTHER PUBLICATIONS

Park, Sang-Il et al., "Printed Assemblies of Inorganic Light-Emitting Diodes for Deformable and Semitransparent Displays", Science, vol. 325, Aug. 21, 2009, 51 pages total.
Chung, Kunook et al., "Transferable GaN Layers Grown on ZnO-Coated Graphene Layers for Optoelectronic Devices", Science, vol. 330, Oct. 29, 2010, 4 pages total.
(Continued)

*Primary Examiner* — David Vu
*Assistant Examiner* — Brandon Fox
(74) *Attorney, Agent, or Firm* — Sughrue Mion, PLLC

(57) ABSTRACT

Disclosed are GaN based light emitting devices and methods of manufacturing the same using post-mechanical treatment. The GaN based light emitting device includes first and second electrodes, and a flexible substrate which are sequentially stacked, an n-type GaN layer, an activation layer, and a p-type GaN layer interposed between the first and second electrodes and forming a core-shell structure, and a buried layer interposed between the flexible substrate and the first
(Continued)

electrode, wherein the first electrode and the core-shell structure are buried in the buried layer.

13 Claims, 9 Drawing Sheets

(51) Int. Cl.
    *H01L 33/06*     (2010.01)
    *H01L 33/32*     (2010.01)
    *H01L 33/24*     (2010.01)
    *H01L 33/38*     (2010.01)

(52) U.S. Cl.
    CPC ....... *H01L 33/38* (2013.01); *H01L 2933/0016* (2013.01)

(58) Field of Classification Search
    USPC ........................................ 257/13, 88; 438/22
    See application file for complete search history.

(56) References Cited

U.S. PATENT DOCUMENTS

| | | | |
|---|---|---|---|
| 2006/0060833 A1* | 3/2006 | Bruckner | ............... B82Y 20/00 |
| | | | 257/13 |
| 2014/0162406 A1 | 6/2014 | Cho et al. | |
| 2014/0242782 A1* | 8/2014 | Cho | .................. H01L 21/02343 |
| | | | 438/478 |

FOREIGN PATENT DOCUMENTS

| | | |
|---|---|---|
| JP | 2003-168762 A | 6/2003 |
| JP | 3762992 B2 | 4/2006 |
| JP | 2012-60165 A | 3/2012 |
| KR | 10-0755610 B1 | 9/2007 |
| KR | 10-0937840 B1 | 1/2010 |
| KR | 10-2011-0024209 A | 3/2011 |

OTHER PUBLICATIONS

Han, Tae-Hee et al., "Extremely efficient flexible organic light-emitting diodes with modified graphene anode", Nature Photonics, Advance Online Publication, Jan. 10, 2012, 6 pages total.
International Search Report (PCT/ISA/210) dated Nov. 6, 2014, issued in International Application No. PCT/KR2014/006987.

* cited by examiner

As fabricated (w/o Tape)

After post-mechanical treatment

GAN BASE LIGHT-EMITTING DIODE AND MANUFACTURING METHOD THEREFOR USING MECHANICAL POST-PROCESSING

TECHNICAL FIELD

The present disclosure relates to light emitting devices, and more particularly to GaN based light emitting devices and methods of manufacturing the same using post-mechanical treatment.

BACKGROUND ART

An inorganic GaN light emitting diode (LED) has characteristics of high efficiency, high brightness, and long life. However, GaN in the inorganic GaN LED is grown by using a sapphire substrate or a silicon substrate. Accordingly, there are limitations in producing various types of products and it is more particularly difficult to realize flexible or stretchable products.

Recently, John Rogers group has introduced a method of transferring an AlInGaP LED onto a flexible substrate. In this method, an AlGaAs layer is used as a sacrificing layer, and the sacrificing layer is etched in selective wet etching. Also, the method discloses a process of transferring a product onto polydimethylsiloxane (PDMS) on which electrodes are formed in advance.

However, this method has limitations as the followings.

1) AlGaN and GaN have low wet-etching selectivity. Accordingly, It is very difficult to apply a method, which uses a sacrificing layer, to a process of manufacturing a GaN based LED.

2) Since a separated product itself is not a device, there is inconveniency to transfer the separated product onto another substrate on which electrodes are formed and put it into contact with the electrodes.

3) Since the electrodes have simply mechanical contacts, problems may occur in ohmic contacts of the electrodes.

4) The product obtained by etching the sacrificing layer has a mesa structure. Accordingly, high-precision alignment is necessary in order to prevent light emitting efficiency from being reduced due to surface recombination.

Furthermore, a method of manufacturing a transferable GaN LED by using weak inter-layer coupling of graphite chunk (HOPG) or boron nitride (BN) has been introduced. However, this method is limited to a very small sized LED and difficult to apply to a device because transfer is performed only in a film type.

DETAILED DESCRIPTION OF THE INVENTION

Technical Problem

Provided are GaN based light emitting devices capable of increasing light emitting efficiency and having flexibility and elasticity as well as having a large area.

Provided are methods of manufacturing these light emitting devices.

Technical Solution

According to an aspect of the present disclosure, a GaN based light emitting device includes: first and second electrodes, and a flexible substrate which are sequentially stacked; an n-type GaN layer, an activation layer, and a p-type GaN layer interposed between the first and second electrodes and forming a core-shell structure; and a buried layer interposed between the flexible substrate and the first electrode, wherein the first electrode and the core-shell structure are buried in the buried layer.

The core-shell structure may have a pyramid type.

The flexible substrate may be a polyethylene teraphthalate (PET) substrate or a polydimethylsiloxane (PDMS) substrate.

According to another aspect of the present invention, a method of manufacturing a GaN based light emitting device includes: forming a metal layer on a substrate; forming a first GaN layer having a difference in a coefficient of thermal expansion from the first GaN layer; primarily weakening adhesion of an interface between the metal layer and the first GaN layer while selectively forming a second GaN layer on the first GaN layer; forming an activation layer on the second GaN layer; forming a third GaN layer on the activation layer; secondarily weakening the adhesion of the interface between the metal layer and the first GaN layer; forming a first electrode contacting with a portion of the third GaN layer; separating the metal layer from the first GaN layer and transferring the first GaN layer and a product formed thereon to a flexible substrate; and forming a second electrode on the separated surface of the first GaN layer.

The first GaN layer may be formed at lower temperature than that at which the second GaN layer is formed.

The selectively forming of the second GaN layer on the first GaN layer may include: selectively forming a mask layer on the first GaN layer; forming holes exposing some portions of the first GaN layer on the mask layer; and forming the second GaN layer on the first GaN layer which is exposed through the holes.

The primary weakening of the adhesion may include forming a first void in the interface between the metal layer and the first GaN layer.

The forming of the first void may include forming the second GaN layer at higher temperature than that at which the first GaN layer is formed.

The metal layer may be formed from a material which has a difference in a coefficient of thermal expansion from the first GaN layer to a degree that the first void is formed in the interface while the second GaN layer is formed.

The second GaN layer may fill the holes and be grown in a pyramid type outside the holes.

The secondary weakening of the adhesion may include: attaching a tape on the third GaN layer; and removing the tape.

The secondary weakening of the adhesion may include increasing a size of the first void in the interface.

The attaching of the tape may include: preparing a tape having an adhesion layer attached; disposing the tape allowing the adhesion layer to be attached to the third GaN layer; and heating the tape at temperature equal to or higher than temperature Tg at which viscosity of the adhesive layer is measured.

Advantageous Effects

As described above, according to one or more of the above embodiments of the present invention, a light emitting device can be manufactured in micro-scale and in a core-shell structure. Accordingly, unlike the existing LEDs, since an LED with surface recombination therein prevented can be realized, an LED having high efficiency can be manufactured.

Furthermore, the entire device is formed on a nonflexible substrate such as a glass substrate or a sapphire substrate and then transferred onto a flexible substrate. Accordingly a light emitting device can be manufactured which has flexibility and elasticity as well as a large area.

In addition, since a device is completely formed on a nonflexible substrate and then transferred onto a flexible substrate, an existing alignment problem can be solved. Separation of the formed device is performed not by wet-etching, but by using a method of weakening an interface between the device and the substrate, a manufacturing process can be simplified, compared to an existing process.

BEST MODE

Figure 1:
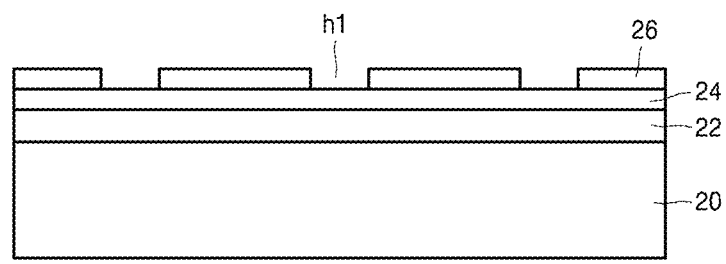
FIGS. 1 to 9 are cross-sectional views illustrating a method of manufacturing a GaN based light emitting device for each process according to an example embodiment.

A GaN based light emitting device according to an embodiment of the present disclosure includes a first electrode, a second electrode, and a flexible substrate which are sequentially stacked; an n-type GaN layer, an activation layer, and a p-type GaN layer which are interposed between the first and second electrodes and form a core-shell structure; and a buried layer interposed between the flexible substrate and the first electrode.

A method of manufacturing a GaN based light emitting device, according to an embodiment of the present disclosure, includes: forming a metal layer on a substrate; forming, on the metal layer, a first GaN layer having a different coefficient of thermal expansion from the metal layer; primarily weakening adhesion of an interface between the metal layer and the first GaN layer while selectively forming a second GaN layer on the first GaN layer; forming an activation layer on the second GaN layer; forming a third GaN layer on the activation layer; secondarily weakening the adhesion of the interface between the metal layer and the first GaN layer; forming a first electrode that contacts a portion of the third GaN layer; separating the metal layer from the first GaN layer and transferring the first GaN layer and a resultant structure formed thereon to a flexible substrate; and forming a second electrode on a surface of the first GaN layer from which the metal layer has been separated.

Mode of the Invention

Hereinafter, the present invention will be described in detail by explaining exemplary embodiments of the invention with reference to the attached drawings. In the drawings, the thicknesses of layers and regions are exaggerated for clarity.

Figure 9:
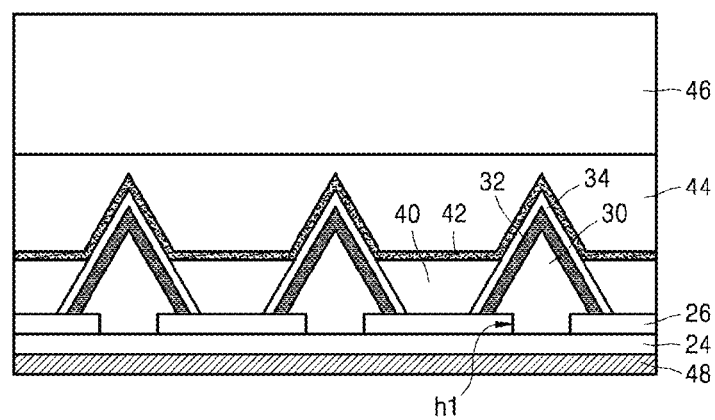

First, a GaN based light emitting device according to an example embodiment is described, Referring to FIG. 9, a first GaN layer 24 is disposed on a bottom electrode 48. The bottom electrode 48 may be, for example, a Ti/Ag electrode. The first GaN layer 24 may be a GaN layer formed at relatively low temperature. A mask layer 26 may be disposed on the first GaN layer 24. A plurality of holes h1 are formed in the mask layer 26. The first GaN layer 24 is exposed through the plurality of holes h1. The mask layer 26 may be a hard mask. The mask layer 26 may be, for example, a silicon oxide ($SiO_2$) layer, a silicon nitride ($Si_3N_4$) layer, or a titanium layer. The mask layer 26 limits an epitaxial region in the first GaN layer 24. A second GaN layer 30 is disposed on the first GaN layer 24 exposed through the holes h1. The second GaN layer 30 protrudes outside the holes h1. The second GaN layer 30 is also disposed on some portions of the mask layer 26 around the holes h1. The second GaN layer 30 fills the holes h1 and appearance thereof is a type of pyramid. The second GaN layer 30 may be an n-type GaN layer. The second GaN layer 30 may be formed at higher temperature than that at which the first GaN layer 24 is formed. Surfaces of exposed portions outside the holes h1 of the second GaN layer 30 are covered with an activation layer 32. Hereinafter, for convenience's sake, the second GaN layer 30 indicates the portions exposed outside the holes h1. The activation layer 32 is in contact with a top surface of the mask layer 26. The activation layer 32 may be a multi-quantum well (MQW) layer. The activation layer 32 may be multi-layers including a compound semiconductor layer. The activation layer may be, for example, an InGaN/GaN layer. The appearance of the activation layer 32 has also a pyramid type like the second GaN layer 30. The surface of the activation layer 32 is covered with a third GaN layer 34. Thus, the appearance of the third GaN layer 34 has also the pyramid type. The third GaN layer 34 is in contact with a top surface of the mask layer 26. The third GaN layer 34 may be a p-type GaN layer. The activation layer 32 and the third GaN layer 34 may be formed at higher temperature than that at which the first GaN layer 24 is formed. The third GaN layer 34 may be formed at lower temperature than that at which the second GaN layer 30 is formed. The first GaN layer 24 and/or the second GaN layer 30 may be n-type semiconductor layers/an n-type semiconductor layer of a GaN based LED. Also, the third GaN layer 34 may be a p-type semiconductor layer of the GaN based LED. Since the activation layer 32 is completely covered with the third GaN layer 34, the second GaN layer 30, the activation layer 32, and the third GaN layer 34 form a core-shell structure. Although not shown in the drawing, an InGaN layer may be disposed on the mask layer 26 between the third GaN layer 34 according to a process. An interlayer insulating layer 40 is disposed on the mask layer 26 between the third GaN layer 34. The interlayer insulating layer 40 may be an electrically insulating material. The interlayer insulating layer 40 is in contact with the third GaN layer 34 on both sides. Some portions of the surface of the third GaN layer 34 are covered with the interlayer insulating layer 40. The height of a top surface of the interlayer insulating layer 40 is smaller than those of vertexes of the third GaN layer 34. A top electrode 42 is formed on the interlayer insulating layer 40. The top electrode 42 covers and contacts portion of the third GaN layer 34 which is higher than the interlayer insulating layer 40. The top electrode 42 may be a transparent electrode. The top electrode 42 may be, for example, an indium tin oxide (ITO) electrode or Ni/Au electrode. A buried layer 44 is disposed on the top electrode 42. The top surface of the buried layer 44 is higher than vertexes (pointed portions) of the top electrode 42. A top surface of the buried layer 44 is flat. The buried layer 44 may be, for example, a polymer layer or a UV-epoxy layer. A flexible substrate 46 is disposed on the buried layer 44. The flexible substrate 46 is attached to the top electrode 42 via the buried layer 44. The flexible substrate 46 may be, for example, a polyethylene teraphtha-late (PET) substrate, or a polydimethylsiloxane (PDMS) substrate.

Hereinafter, a method of manufacturing a GaN based light emitting device according to an example embodiment is described.

Referring to FIG. 1, a metal layer 22 is formed on a substrate 20. The substrate 20 may be a nonflexible substrate such as a glass substrate or a sapphire substrate. The metal layer 22 is formed from a material having a large difference in a coefficient of thermal expansion from the first GaN layer 24 which is formed next. The metal layer 22 may be formed of, for example, a titanium (Ti) layer. The first GaN layer 24 is formed on the metal layer 22. The first GaN layer 24 is formed at relatively low temperature compared to other GaN layers to be subsequently formed. A mask layer 26 is formed on the first GaN layer 24. After the mask layer 26 is formed, a plurality of holes h1 are formed in the mask layer 26 in order to expose the first GaN layer 24. The plurality of holes h1 become passages where other GaN layers are grown in subsequent processes. In consideration of this, the holes h1 may be formed with a proper diameter. The mask layer 26 may be a hard mask layer. The mask layer 26 may be formed of, for example, a silicon oxide ($SiO_2$) layer, a silicon nitride ($Si_3N_4$) layer, or a titanium layer.

Figure 2:
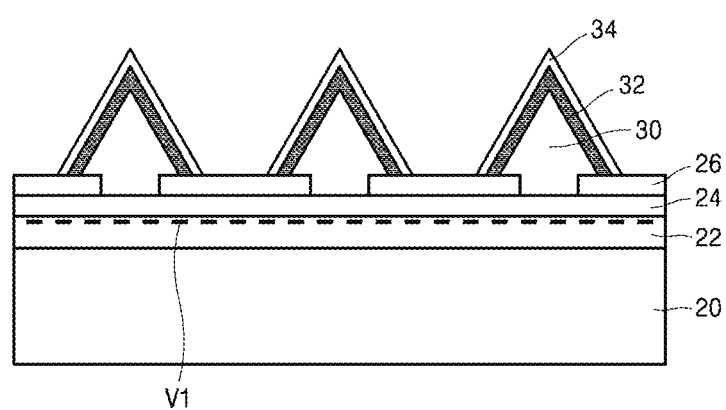

Referring to FIG. 2, a second GaN layer 30 is formed on the first GaN layer 24 which is exposed through the holes h1. The second GaN layer 30 may be an n-type GaN layer. Due to the presence of the mask layer 26, the second GaN layer 30 may be selectively grown only on the first GaN layer 24 which is exposed through the holes h1. The second GaN layer 30 may be grown in an epitaxial method, for example, a metal organic chemical vapor deposition (MOCVD). At this time, by controlling growth conditions, the second GaN layer 30 has protruding portions outside the holes h1 in a pyramid type. The second GaN layer 30 may be also formed by using molecular beam epitaxy (MBE). The second GaN layer 30 fills the holes h1 and is formed on some portions of the mask layer 26 around the holes h1. The second GaN layer 30 may be formed at higher temperature than that at which the first GaN layer 24 is formed. For example, the second GaN layer 30 may be grown at about 1040° C. Like this, while the second GaN layer 30 is formed, a void may be formed in an interface between the metal layer 22 and the first GaN layer 24 due to a difference in a coefficient of thermal expansion between the metal layer 22 and the first GaN layer 24. For example, when the metal layer 22 is a Ti layer and the second GaN layer 30 is grown at high temperature of about 800° C. or higher as described above, out-diffusion of Ga occurs in an interface of the first GaN layer 24 and N is diffused to the metal layer 22 to form TiN. As a result, in a high temperature process where the second GaN layer 30 is formed, a first void V1 may be formed in the interface between the first GaN layer 24 and the metal layer 22. Due to presence of the first void V1, adhesion of the first GaN layer 24 and the metal layer 22 may be weakened. In FIG. 2, the first void V1 is symbolically represented for convenience's sake.

Then, the second GaN layer 30 is formed and an activation layer 32 is formed on a surface of the second GaN layer 30. The activation layer 32 may be an MQW layer. The activation layer 32 may be formed in multi layers including a compound semiconductor layer. For example, the activation layer 32 may be formed of an InGaN/GaN layer. The activation layer 32 may be formed in a MOCVD or MBE method at temperature of about 770° C. Then, a third GaN layer 34 is formed on a surface of the activation layer 32. The third GaN layer 34 may be a p-type GaN layer. The third GaN layer 34 may be formed in a MOCVD or MBE method at temperature of about 970° C.

Furthermore, although not shown in the drawing, some InGaN may be stacked on the mask layer 26 in a process of forming the activation layer 32.

Figure 3:
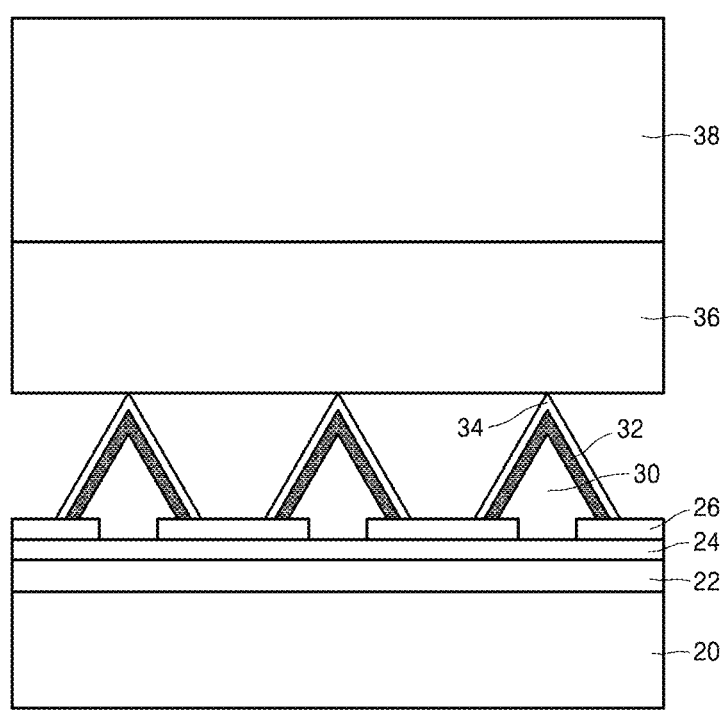
Figure 4:
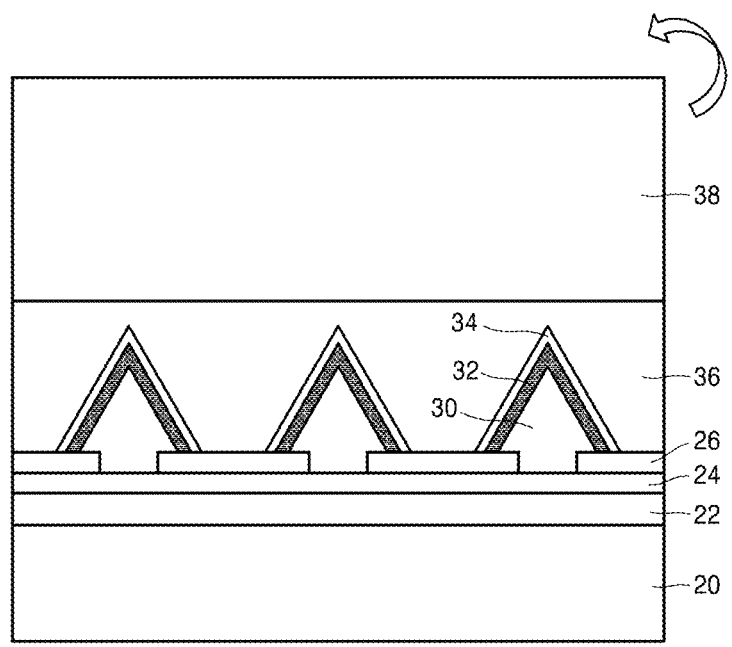

Referring to FIG. 3, after the third GaN layer 34 is formed, a predetermined adhesive tape 38 may be disposed on the third GaN layer 34. The adhesive tape 38 may be formed from, for example, polyimide. An adhesive layer 36 adheres to a bottom surface of the adhesive tape 38. The adhesive layer 36 may be formed from, for example, silicone. When the adhesive tape 38 is disposed, the adhesive layer 36 is in contact with vertexes (pointed portions) of the third GaN layer 34. The thickness of the adhesive layer 36 may be greater than a height from the mask layer 26 to the vertexes of the third GaN layer 34. After the adhesive tape 38 is disposed as shown in FIG. 3, a product shown in FIG. 3 is heated to temperature Tg at which viscosity of the adhesive layer 36 is measured. Due to this heating, the third GaN layer 34 starts to be covered with the adhesive layer 36. When the heating temperature is Tg or higher, the third GaN layer 34 is completely covered with the adhesive layer 36 as shown in FIG. 4. At this time, the heating is stopped. After a predetermined time has passed, the adhesive tape 38 is detached. The adhesive layer 36 is also separated from the third GaN layer 34 together with the adhesive tape 38. The adhesive tape 38 may be detached in a mechanical scheme. A tape, which is controllable with 25M/100 mm when it is detached, may be used as the adhesive tape 38. By using this tape, adhesion of the interface between the first GaN layer 24 and the metal layer 22 gets more weakened, but the first GaN layer 24 may be prevented from being peeled off from the metal layer 22.

Figure 5:
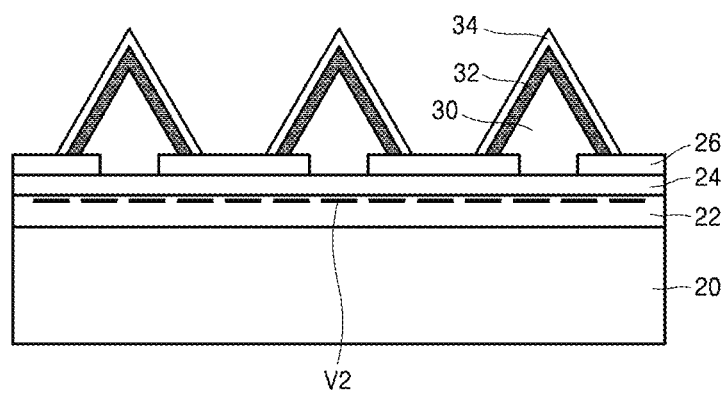

FIG. 5 illustrates a result of detaching the adhesive tape 38. The first void (V1 in FIG. 2) formed between the first GaN layer 24 and the metal layer 22 increases in size in the process of detaching the adhesive tape 38. As a result, a second void V2 may be present, which has a larger size than that of the first void V1, in the interface between the first GaN layer 24 and the metal layer 22 as shown in FIG. 5. Thus, the adhesion in the interface between the first GaN layer 24 and the metal layer 22 gets further more weakened, such that the first GaN layer 24 and a layer structure formed thereon may be easily separated in subsequent processes.

Figure 6:
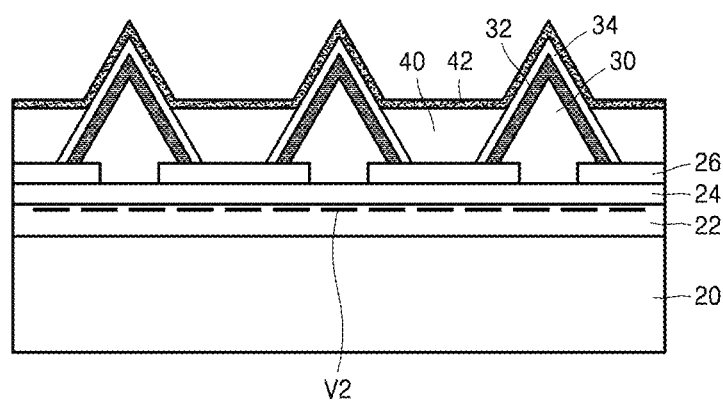

Referring to FIG. 6, an interlayer insulating layer 40 is formed on the mask layer 26 between the third GaN layers 34. The interlayer insulating layer 40 may be formed from an electrically insulating material. The interlayer insulating layer 40 is formed to cover some portions of the third GaN layer 34. The interlayer insulating layer 40 is formed so that a top surface thereof is lower than vertexes of the third GaN layer 34. The top surface of the interlayer insulating layer 40 may be also lower than vertexes of the second GaN layer 30. A top electrode 42 is formed on the interlayer insulating layer 40. The top electrode 42 may be formed to cover an entire top surface of the interlayer insulating layer 40 and cover entire exposed surface of the third GaN layer 34. The top electrode 42 may be a transparent electrode. The top electrode 42 may be formed of, for example, an ITO electrode, or a Ni/Au electrode.

Figure 7:
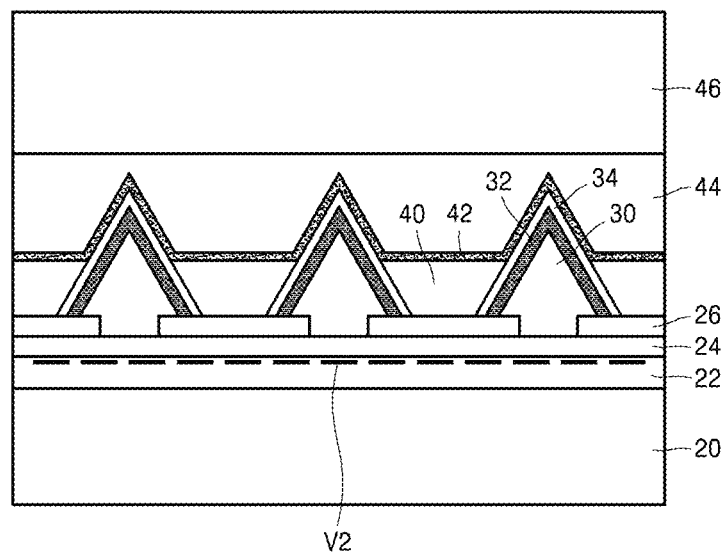
Figure 8:
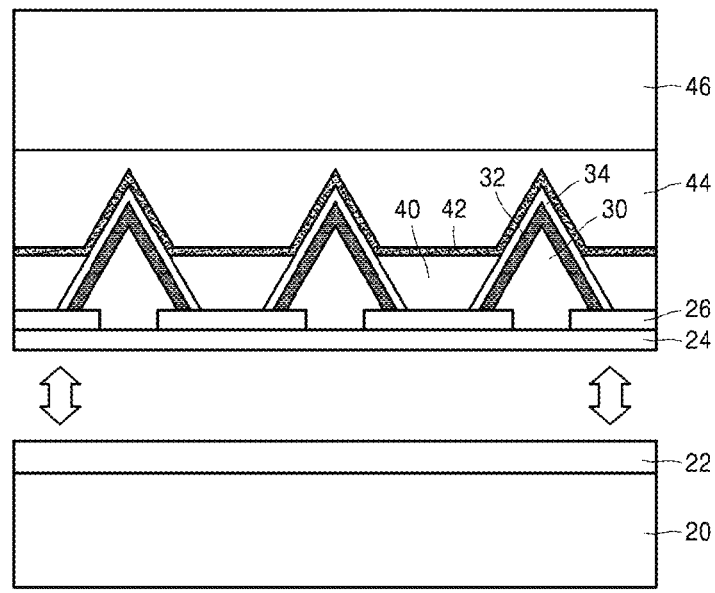

Referring to FIG. 7, a flexible substrate 46 is attached to the top electrode 42. A buried layer 44 is attached to a bottom surface of the flexible substrate 46. The buried layer 44 may be formed of a polymer layer or a UV epoxy layer. The flexible substrate 46 is in contact with the top electrode 42 via the buried layer 44. The buried layer 44 is in direct contact with both a flat surface and an inclined surface of the top electrode 42. In this state, the substrate 20 is removed as shown in FIG. 8. Since the adhesion of the interface between the first GaN layer 24 and the metal layer 22 is sufficiently weak, the substrate 20 may be easily removed together with the metal layer 22. When the substrate 20 and the metal layer 22 are simultaneously removed, a bottom electrode 48 is formed on a bottom surface of the first GaN layer 24 and a GaN based LED having flexibility as well as a large area is formed, as shown in FIG. 9.

Furthermore, in the above described manufacturing method, one of the top and bottom electrodes 42 and 48 may be represented as a first electrode and another as a second electrode.

Figure 10:
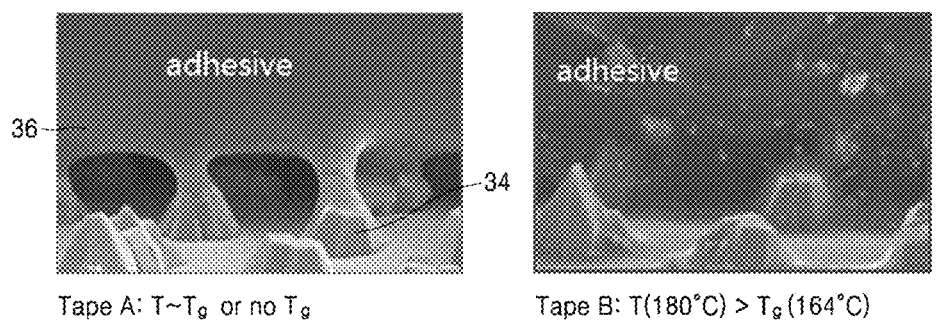
FIG. 10 is scanning electron microscope (SEM) images illustrating a process of attaching a tape for post-mechanical treatment in a method of manufacturing a GaN based light emitting device according to an example embodiment.

FIG. 10 is images illustrating a process of attaching the adhesive tape 38 to the third GaN layer 34.

Referring to FIG. 10, when heating temperature reaches Tg (about 164° C.), it can be seen that the adhesive layer 36 starts to cover the third GaN layer 34 of pyramid type (a left image), and, when the heating temperature is higher than Tg (about 180° C.), the third GaN layer 34 is completely covered with the adhesive layer 36 (a right image).

Figure 11:
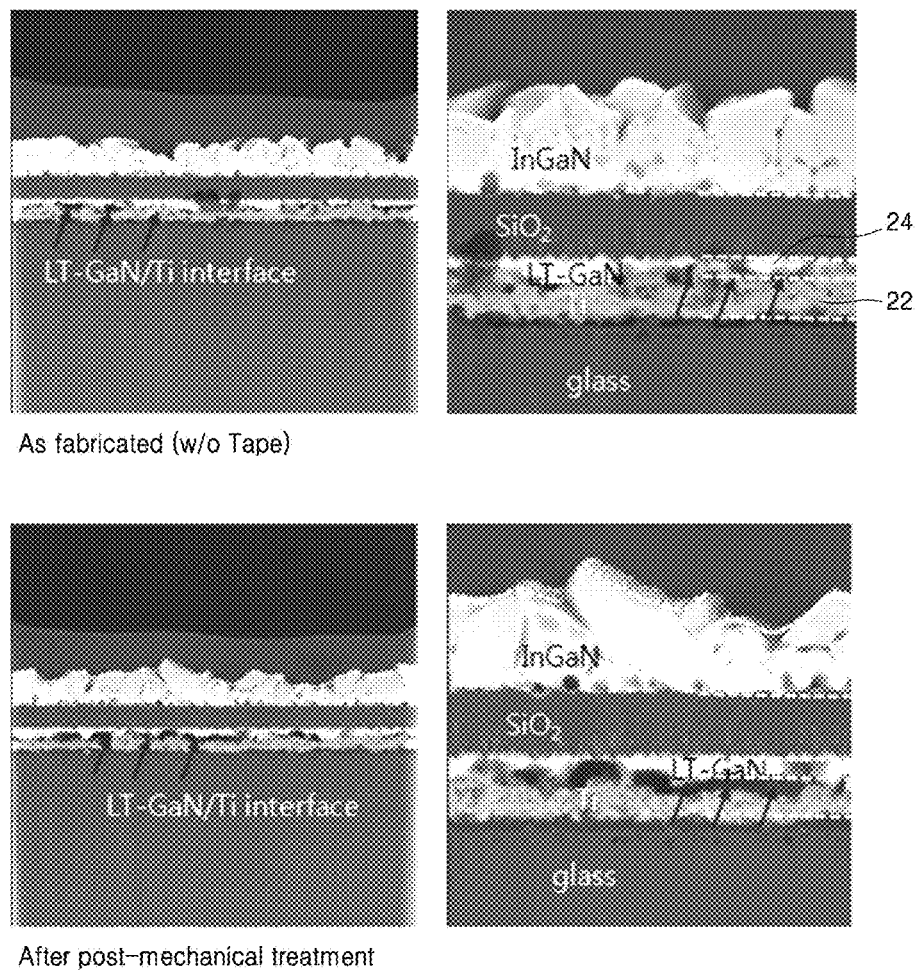
FIG. 11 is SEM images illustrating states of an interface before and after the post-mechanical treatment in a method of manufacturing a GaN based light emitting device according to an example embodiment.

FIG. 11 is images illustrating that the interface between the metal layer 22 and the first GaN layer 24 is weakened in processes of high temperature growth and adhesive tape detachment in the above-described manufacturing method.

A left top image of FIG. 11 shows a state of the interface between the metal layer 22 and the first GaN layer 24 right after the second GaN layer 30 is formed at high temperature. A right top image is an enlarged one of the left top image. In the right top image, it can be seen that the voids (portions indicated with the arrows) are formed in the interface between the metal layer 22 and the first GaN layer 24.

A left bottom image of FIG. 11 shows a state of the interface between the metal layer 22 and the first GaN layer 24 after the processes of high temperature growth and adhesive tape detachment. A right bottom image is an enlarged one of the left bottom image. Referring to the right bottom image, it can be seen that the voids (portions indicated with the arrows) are more enlarged in the interface between the metal layer 22 and the first GaN layer 24.

Figure 12:
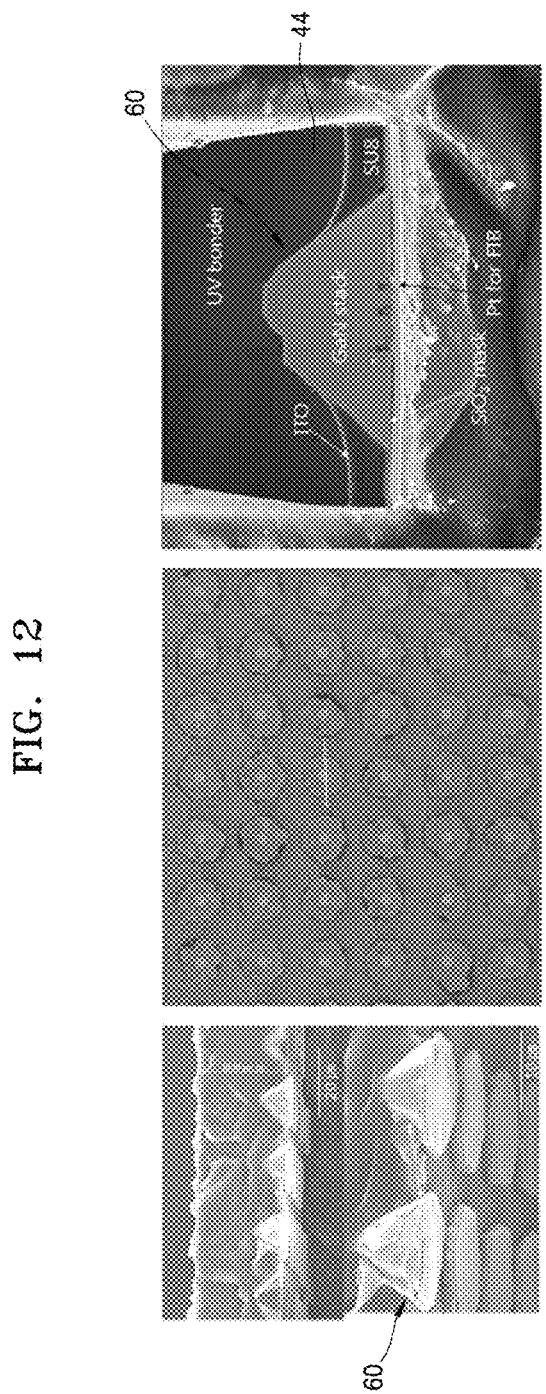
FIG. 12 is SEM images illustrating a case where a GaN based LED array and a GaN based LED are validly buried in a polymer which is attached to a flexible substrate where the GaN based LEDs are manufactured by a method of manufacturing a GaN based light emitting device according to an example embodiment.

FIG. 12 shows images for products that the first GaN layer 24 and the metal layer 22 are completely separated in the above-described manufacturing method.

A left image shows an array of GaN based LEDs 60 of a pyramid type. The middle image shows a plan view of the array. A right image shows that the GaN based LED 60 is validly buried in the buried layer 44 of the flexible substrate.

It should be understood that the exemplary embodiments described therein should be considered in a descriptive sense only and not for purposes of limitation. Descriptions of features or aspects within each embodiment should typically be considered as available for other similar features or aspects in other embodiments.

INDUSTRIAL APPLICABILITY

A GaN based light emitting device (LED) and a method of manufacturing the same using mechanical post-treatment, according to an embodiment of the present disclosure, may be used in LEDs and in production thereof and may also be used in LEDs having flexibility as well as a large area and in production thereof.

The invention claimed is:

1. A GaN based light emitting device comprising:
   first and second electrodes, and a flexible substrate which are sequentially stacked;
   an n-type GaN layer, an activation layer, and a p-type GaN layer interposed between the first and second electrodes and forming a core-shell structure; and
   a buried layer interposed between the flexible substrate and the first electrode,
   wherein the first electrode and the core-shell structure are buried in the buried layer.

2. The GaN based light emitting device of claim 1, wherein the core-shell structure has a pyramid type.

3. The GaN based light emitting device of claim 1, wherein the flexible substrate is a polyethylene teraphthalate (PET) substrate or a polydimethylsiloxane (PDMS) substrate.

4. A method of manufacturing a GaN based light emitting device, comprising:
   forming a metal layer on a substrate;
   forming a first GaN layer having a difference in a coefficient of thermal expansion from the metal layer;
   primarily weakening adhesion of an interface between the metal layer and the first GaN layer while selectively forming a second GaN layer on the first GaN layer;
   forming an activation layer on the second GaN layer;
   forming a third GaN layer on the activation layer;
   secondarily weakening the adhesion of the interface between the metal layer and the first GaN layer;
   forming a first electrode contacting with a portion of the third GaN layer;
   separating the metal layer from the first GaN layer and transferring the first GaN layer and a product formed thereon to a flexible substrate; and
   forming a second electrode on the separated surface of the first GaN layer.

5. The method of claim 4, wherein the first GaN layer is formed at lower temperature than that at which the second GaN layer is formed.

6. The method of claim 4, wherein the selective forming of the second GaN layer comprises:
   selectively forming a mask layer on the first GaN layer;
   forming holes exposing some portions of the first GaN layer on the mask layer; and
   forming the second GaN layer on the first GaN layer which is exposed through the holes.

7. The method of claim 6, wherein the second GaN layer fills the holes and is grown in a pyramid type outside the holes.

8. The method of claim 4, wherein the primary weakening of the adhesion comprises forming a first void in the interface between the metal layer and the first GaN layer.

9. The method of claim 8, wherein the forming of the first void comprises forming the second GaN layer at higher temperature than that at which the first GaN layer is formed.

10. The method of claim 8, wherein the metal layer is formed from a material which has a difference in a coefficient of thermal expansion from the first GaN layer to a degree that the first void is formed in the interface while the second GaN layer is formed.

11. The method of claim 8, wherein the secondary weakening of the adhesion comprises increasing a size of the first void in the interface.

12. The method of claim 4, wherein the secondary weakening of the adhesion comprises:
   attaching a tape on the third GaN layer; and
   removing the tape.

13. The method of claim 12, wherein the attaching of the tape comprises:
   preparing a tape having an adhesion layer attached;
   disposing the tape allowing the adhesion layer to be attached to the third GaN layer; and
   heating the tape at temperature equal to or higher than temperature Tg at which viscosity of the adhesive layer is measured.

\* \* \* \* \*